United States Patent [19]

Kiuchi et al.

[11] 4,074,101
[45] Feb. 14, 1978

[54] INDUCTION HEATING APPARATUS USING A PAIR OF INVERSELY PARALLEL CONNECTED GATE-CONTROLLED SWITCHING DEVICES

[75] Inventors: Mitsuyuki Kiuchi; Keizo Amagami; Takumi Mizukawa; Hideyuki Kominami, all of Kadoma, Japan

[73] Assignee: Matsushita Electric Industrial Co., Ltd., Japan

[21] Appl. No.: 657,307

[22] Filed: Feb. 11, 1976

[30] Foreign Application Priority Data

Feb. 14, 1975 Japan .................................. 50-19251

[51] Int. Cl.[2] ............................................. H05B 5/04
[52] U.S. Cl. ...................... 219/10.49 R; 55/DIG. 36; 219/10.55 B; 219/10.77; 307/252 Q; 323/24; 363/160
[58] Field of Search ............... 219/10.49, 10.77, 10.81, 219/10.55 R, 10.55 E, 10.55 F, 10.55 D; 321/69 R, 45, 14, 6; 323/24, 34, 25; 55/DIG. 36, 101; 126/299 B; 98/115 K, 115 R; 307/252 T, 252 UA, 252 Q, 252 N; 363/160

[56] References Cited

U.S. PATENT DOCUMENTS

| | | | |
|---|---|---|---|
| 3,088,453 | 5/1963 | Grahn et al. | 219/10.55 D |
| 3,268,794 | 8/1966 | Tanaka | 321/66 |
| 3,538,417 | 11/1970 | Nijhof et al. | 363/160 |
| 3,587,555 | 6/1971 | Cerola | 219/400 UX |
| 3,693,069 | 9/1972 | Kelley et al. | 219/10.77 UX |
| 3,707,667 | 12/1972 | Gyugyi | 321/69 R |
| 3,735,237 | 5/1973 | Derby | 219/10.55 B |
| 3,743,919 | 7/1973 | Bingley | 321/69 R |
| 3,747,301 | 7/1973 | Glover et al. | 55/DIG. 36 |
| 3,821,509 | 6/1974 | Amagami et al. | 219/10.77 |
| 3,898,410 | 8/1975 | Peters | 219/10.49 |
| 3,925,633 | 12/1975 | Partridge | 219/10.77 |
| 4,002,875 | 1/1977 | Kiuchi et al. | 219/10.77 |

Primary Examiner—Bruce A. Reynolds
Attorney, Agent, or Firm—Robert E. Burns; Emmanuel J. Lobato; Bruce L. Adams

[57] ABSTRACT

An induction heating apparatus comprising a pair of inversely parallel-connected gate-controlled switching devices connected to an alternating current source, a resonant circuit including an induction heating coil and a variable frequency gating circuit for firing the switching devices to generate oscillations through the conducting device and the induction heating coil. The switching devices are gated into conduction in succession in a first order during the positive half cycle of the alternating current and in a reversed order during the negative half cycle. A zero crosspoint detector is provided to inhibit gating when the source voltage is near zero crosspoint level and to control the gating frequency in accordance with the instantaneous value of the source voltage to increase the turn-off time of the switching devices for lower input source voltage.

23 Claims, 26 Drawing Figures

INDUCTION HEATING APPARATUS USING A PAIR OF INVERSELY PARALLEL CONNECTED GATE-CONTROLLED SWITCHING DEVICES

BACKGROUND OF THE INVENTION

The present invention relates generally to induction heating and particularly to an induction heating apparatus which comprises a cycloconverter including a pair of inversely parallel connected gate-controlled switching devices.

In U.S. Pat. No. 3,821,509 issued to the same assignee as the present invention, there is described a solid state power converter which includes a gate controlled unidirectional switching device and a feedback diode inversely parallel connected to the switching device, and a resonant or commutating circuit connected in parallel with the switching device. The resonant circuit includes an induction heating coil and a capacitor which are tuned to a high frequency of the order of 20 kHz. A full-wave rectifier supplies rectified, unfiltered unidirectional voltage to the power converter. A gating circuit is provided to drive the switching device directly from the rectified unidirectional voltage. Upon gating of the switching device, the charge stored on the capacitor will be oscillated through the gated switching device and through the induction heating coil to reversely charge the capacitor. Upon reversal of the polarity, the switching device is turned off and a reverse current will flow through the feedback diode and through the induction heating coil to return the capacitor to the original charge minus any losses due to loading.

However, a comparatively greater number of components used in the known power converter with the consequential increase in cost and a greater loss of power due to inefficient operation have prevented the widespread use of induction heating apparatus for household applications.

SUMMARY OF THE INVENTION

It is an object of the present invention to provide an improved induction heating apparatus which comprises a cycloconverter including a pair of inversely parallel connected gated conducting devices and a novel gating circuit for gating the switching devices in predetermined orders in synchronism with each half cycle of the voltage of alternating current source.

It is another object of the invention to provide an induction heating apparatus which eliminates the need of full-wave rectification to thereby reduce the number of components required and increase the overall efficiency of the apparatus.

It is a further object of the invention to provide an improved induction heating apparatus which is free from generating unwanted radio frequency components which would produce radio inteference to nearby electrical appliances.

BRIEF DESCRIPTION OF THE DRAWINGS

These and other objects, features and advantages of the present invention will be understood from the following detailed description when read in conjunction with the accompanying drawings, in which:

FIG. 7(a-f) is a waveform diagram useful for explaining the operation of the circuit of FIGS. 2 to 4;

DESCRIPTION OF THE PREFERRED EMBODIMENTS

Figure 1:
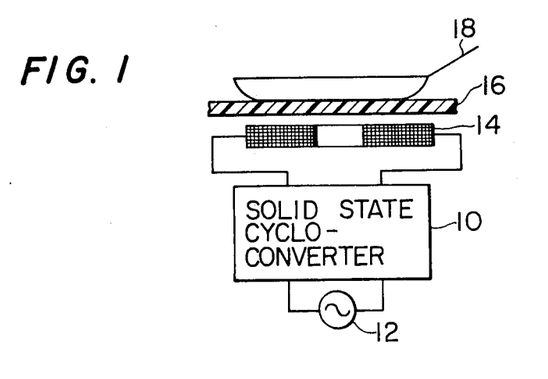
FIG. 1 is a schematic diagram of an embodiment of the invention.
Figure 2:
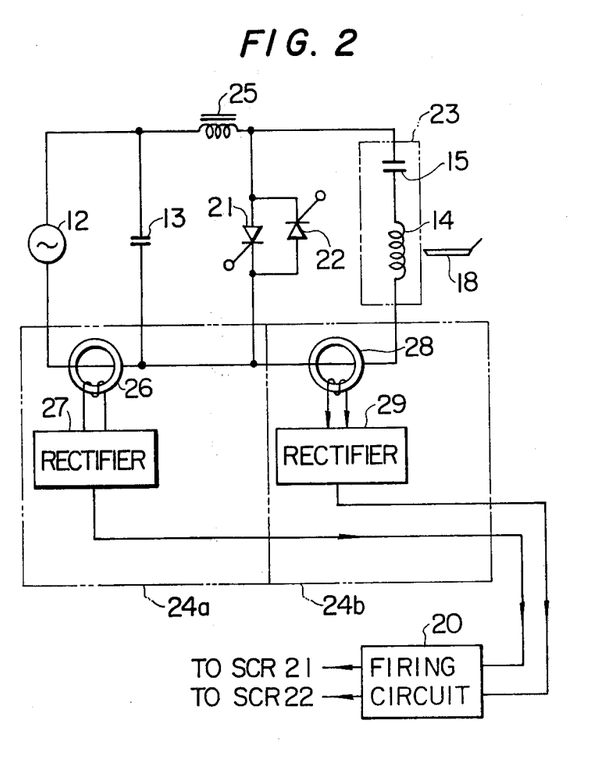
FIG. 2 is a circuit diagram of an embodiment of the invention in which a pair of inversely parallel connected SCR+s is shown connected in parallel to a resonant circuit.

Referring now to FIGS. 1 to 7 of the drawings, a first preferred embodiment of the present invention is illustrated. The induction heating apparatus of FIG. 1 comprises generally a solid state cycloconverter 10 energized by a commercial AC power source 12 and an induction heating coil 14 disposed underside of a nonmetallic utensil support 16 on which a metal pan load 18 is placed. The cycloconverter 10 generates a high frequency signal in the ultrasonic range to excite the induction heating coil 14 which electromagnetically couples with the pan load 18. As shown in FIG. 2, the solid state cycloconverter 10 comprises a pair of gated semiconductor conducting devices such as silicon-controlled rectifiers 21 and 22 inversely parallel connected to first and second terminals 31, 32 of the AC voltage source 12, a resonant circuit 23 including the induction heating coil 14 and a resonant capacitor 15 in parallel circuit relationship with the SCR pair, and a firing circuit 20 which generates gating-on pulses for the SCR's 21 and 22. A filter induction 25 is inserted between terminal 31 and the oscillatory loop comprising SCR pair and resonant circuit 23, and a filter capacitor 13 connected across the filter inductor 25 and the SCR pair 21, 22, to eliminate high frequency energization current generated from the oscillatory loop to prevent it from disturbing the alternating current source 12. Between the terminal 32 and capacitor 13 is connected an input power detector 24a which includes a current transformer 26 which detects the current flow from the power supply 12 to the oscillatory loop or output circuit. The detected current is converted into a DC voltage by means of a rectifier 27 and fed into a firing circuit 20. An output power detector 24b of similar configuration as 24a is connected in the oscillatory loop to sense the output current, the output from the detector 24b being connected to the firing circuit 20.

Figure 4:
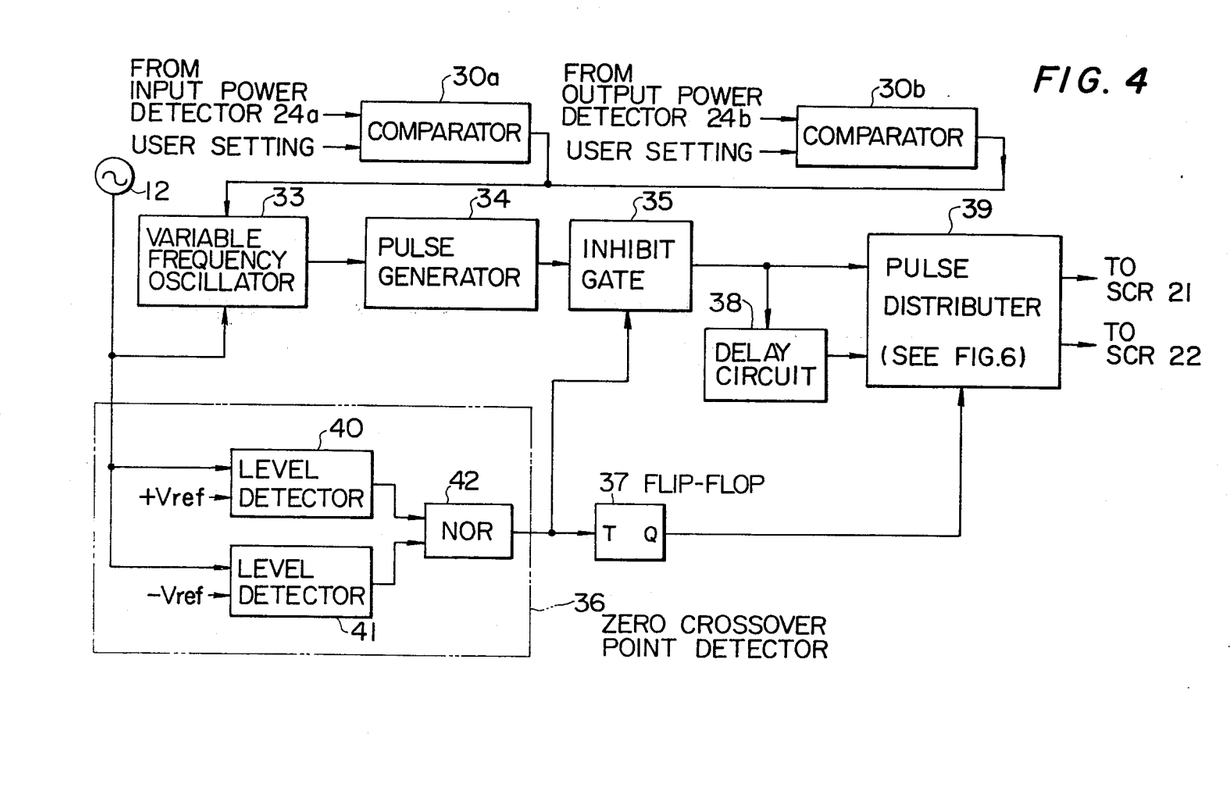
FIG. 4 is a circuit diagram of a firing circuit of the invention used in connection with the circuits of FIGS. 2 and 3.
Figure 5:
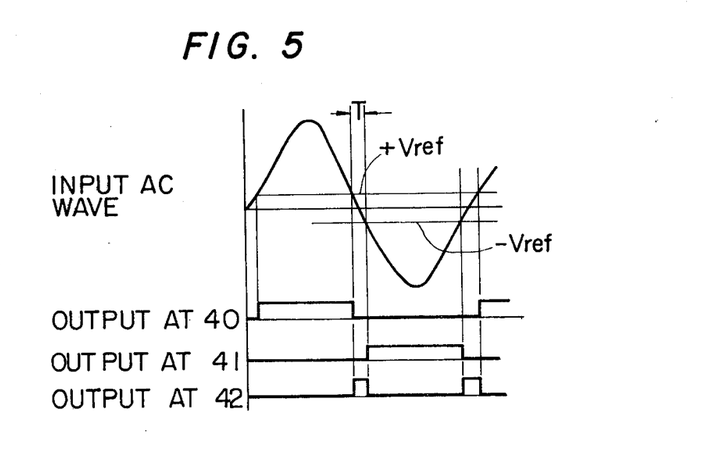
FIG. 5 is a graph showing a series of waveforms appearing in a zero crosspoint detector of FIG. 4.

In FIG. 4, the firing circuit 20 includes a first comparator or differential amplifier 30a and a second comparator or differential amplifier 30b. The output from the input power detector 24a is connected to the first comparator 30 to compare the input power level with a user's setting value and generate an output when the input level is lower than the user's setting. The comparator 30a feeds its output to a variable frequency oscillator 33 such as voltage-controlled oscillator of the type NE555V available from Signetics Corp. to control its frequency in such manner that when the input power level is lower than the preset value in case where a false load is placed on the apparatus, the oscillator is brought to a lower frequency in order to reduce the power delivered to the false load. The output power detector 24b connects its output to the second comparator 30b for comparison with the desired power level to produce a difference signal which is also applied to the oscillator 33. Excessive output power will be compensated for by operating the oscillator 33 at a lower frequency, and when more power is desired the frequency will be increased. In order to assure satisfactory firing of the gate controlled switching devices 21 and 22 to sustain oscillations in the cycloconverter circuit 10 at the beginning of each half cycle of input source voltage, the variable frequency oscillator 33 is connected to the prime voltage source 12 in such manner than when the instantaneous source voltage is near the zero voltage level, the oscillator frequency is reduced to a minimum to allow sufficient quiescent time for the charging capacitor 15 during the period of the low input voltage. The variable frequency oscillator 33 has its output connected to a pulse generator 34 to supply it with variable frequency oscillation signal, the pulse generator 34 converting the input oscillations into a train of pulses suitable for firing the gate controlled switches 21 and 22. A firing pulse inhibiting circuit formed by an inhibit gate 35 and a zero crossover point detector 36 is provided to prevent the firing of SCR's 21 and 22 when the alternating current source voltage is near zero voltage point between successive half waves of the input voltage waveform. The inhibit gate 35 is connected to the output of the pulse generator 34 to inhibit the passage of pulses therethrough by the control pulse supplied from the zero crossover point detector 36. The detector 36 comprises two level detectors 40 and 41 and a NOR gate 42. The level detector 40 has its one input coupled to the voltage source 12 and has its other input connected to a reference voltage of positive polarity ($+V_{ref}$) to produce a signal when the input source voltage is above the reference voltage. The level detector 41, on the other hand, has its one input coupled to the voltage source 12 while its other input coupled to a reference voltage of negative potential ($-V_{ref}$) so that an output signal is produced when the input voltage is greater than the negative reference voltage during its negative half cycle. The positive and negative reference voltages are chosen at respective levels slightly above and below the zero voltage level to provide an inhibit interval during which no firing occurs. The waveforms generated by the level detectors 40 and 41, as illustrated in FIG. 5, are fed to the NOR gate 42 to produce a gate control pulse for an inhibit gate 35.

The pulse generator 34 output is connected to a delay circuit 38 and to one input of a pulse distributer 39. The pulses supplied to the delay circuit 38 are delayed by an interval determined by the tuned frequency of the resonant circuit 23. The flip-flop 37 is triggered from its quiescent state at the leading edge of a pulse from the NOR gate 42 and back to its quiescent state at the leading edge of the next pulse to generate a symmetrical square wave pulse (FIG. 7c). The square wave pulse is applied to the pulse distributer 39 to alternate the order of firing the SCR's 21 and 22 at the beginning of each half cycle of the source voltage.

Figure 6:
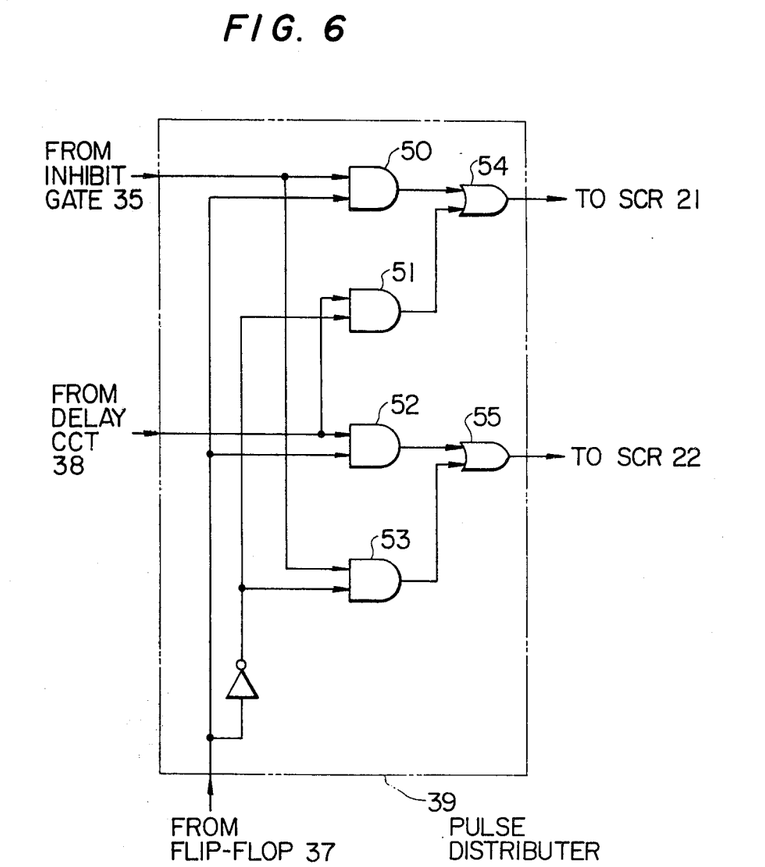
FIG. 6 is a detailed circuit of a pulse distributor of FIG. 4.

In FIG. 6 the pulse distributor 39 is shown comprising a number of logic gates. The pulses directly supplied from the pulse generator through inhibit gate 35 are connected to AND gates 50 and 53, while the pulses from the delay circuit are connected to AND gates 51 and 52. The output from the flip-flop 37 is directly coupled to the AND gates 50 and 52 and its inverted output is coupled to the AND gates 51 and 53. The AND gates 50 and 52 are switched during the positive half cycle of the AC input wave, while the AND gates 51 and 53 are switched during the negative half cycle of the AC input. During the positive half cycle of the input waveform, the non-delayed pulses from inhibit gate 35 are passed through the switched gate 50 to the control gate of SCR 21 via OR gate 54 and the delayed pulses are passed through the switched gate 52 to the control gate of SCR 22 via OR gate 55 so that SCR 21 is gated on repetitiously by the non-delayed pulses while SCR 22 is gated on repetitiously at the same rate as SCR 21 but at later times by the delayed pulses. The oscillations so occurred in the cycloconverter 10 are slightly below the tuned frequency of the resonant circuit 23.

During the negative half cycle of the AC input voltage, the non-delayed pulses are passed through the switched gate 53 to SCR 22 via OR gate 55, while the delayed pulses are passed through the switched gate 51 to SCR 21 via OR gate 54, so that SCR 22 is fired earlier than SCR 21. Therefore, when the input terminal 32 is positive with respect to terminal 31, SCR 22 is fired by the non-delayed pulses to trigger high frequency oscillations and SCR 21 is fired to allow the next half cycle of the oscillation current to flow therethrough.

The operation of the circuits of FIGS. 2 and 4 may best be understood by reference to FIG. 7. Assume that the terminal 31 is positive with respect to terminal 32 and the capacitor 15 has charged up to a voltage sufficient to produce an oscillating current through the resonant circuit should SCR 21 be gated on (FIG. 7d), the turn-on of SCR 21 will cause the charge stored on the capacitor 15 to be oscillated through the now conducting SCR 21 and through the resonant circuit 23 in a positive half cycle of the oscillation to reversely charge the capacitor 15. The reverse polarity charge on capacitor 15 will cause a reverse current flow in the negative half cycle of the oscillation when SCR 22 is gated on by the successive gating-on pulse which occurs at the delayed timing provided by the delay circuit 38 (FIG. 7e). During the reverse current flow SCR 21 will be reverse biased and will be maintained off. After completion of the oscillation SCR 22 will be turned off by the positive source voltage before the next pulse triggers SCR 21 to cause successive oscillations. This process will repeat as long as the source voltage retains the same voltage polarity.

During the next negative half cycle of the source voltage, the order of application of gating-on pulses is reversed so that SCR 22 will be fired earlier than SCR 21.

In the parallel circuit arrangement of FIG. 2 in which capacitor 15 is parallel connected with the SCR pair 21, 22 to voltage source 12, a problem will be encountered when the input AC voltage is at the beginning of each half wave, if a gating-on pulse is applied when the charge stored on capacitor 15 is insufficient to sustain oscillations. Under such conditions, the gated SCR will remain conductive to provide a short circuit across the resonant circuit 23 so that the charge stored on the capacitor 15 will be exhausted. This inoperative condition will persist until change occurs in the voltage polarity which causes the conducting SCR to be reversely biased to thereby turn it off.

For this purpose the inhibit gate 35 prevents the application of gating-on pulses during the time while the source voltage is below a predetermined level, while allowing the capacitor 15 to be charged up to a voltage level sufficient to sustain oscillations. The variable frequency oscillator 33 in turn causes the intervals between successive early gating-on pulses to vary in accordance with the source voltage. While the source voltage is low, the longer intervals are provided to allow the capacitor 15 a sufficient quiescent time to build up charge.

Figure 3:
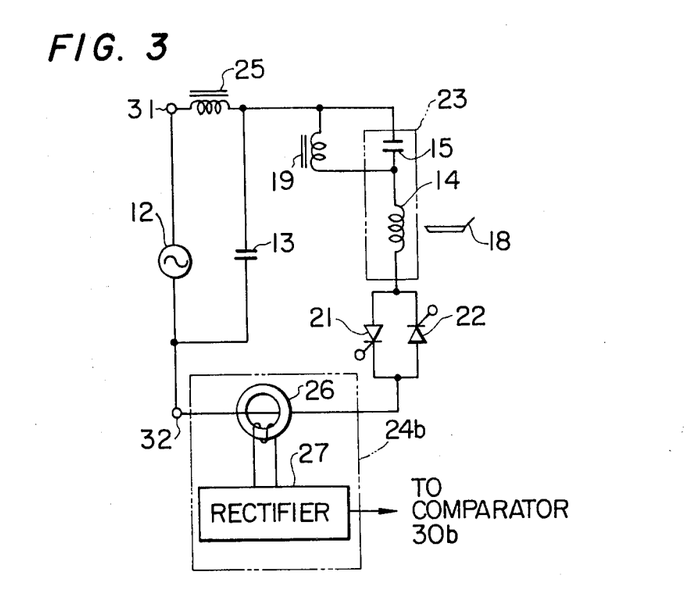
FIG. 3 is a circuit diagram of another embodiment of the invention in which the SCR pair is connected in series circuit relation to the resonant circuit.

The resonating circuit 23 may be coupled in a series circuit relationship with the SCR pair 21, 22 as shown in FIG. 3. In operation, assume that terminal 31 is positive with respect to terminal 32, and SCR 21 is turned on. Upon the turn-on of SCR 21, the capacitor 15 will be positively charged to the source voltage and an oscillatory current will flow through the now conducting SCR 21 and through the resonating circuit 23 and completes its first half cycle when the capacitor 15 is reversely charged whereupon the oscillatory current will flow in reverse direction when SCR 22 is gated on by the delayed gating-on pulse during the next half cycle of the oscillation. The frequency of the oscillation is slightly below the tuned frequency of the resonating circuit 23, as in the parallel circuit arrangement of FIG. 2.

Similarly, the problem as discussed above in connection with FIG. 2 will occur when gating of SCR's occurs at low source voltages. Under such conditions, the gated switching device will remain conductive until it will be turned off by a reverse voltage in the next half cycle of the source voltage. The inhibit circuit arrangement and the variable frequency oscillations previously described in connection with the circuit of FIGS. 2 and 4 are also employed effectively to avoid such undesirable effects.

In this series circuit arrangement of FIG. 3 a capacitor 13 is connected across the terminal 32 and a point intermediate the filter inductor 25 and capacitor 15 to provide a path for the oscillatory current. A reset inductor 19 is connected across the capacitor 15 to release the charge stored thereon into 19. The power detector 24b is connected in series with terminal 32 and the SCR pair 21, 22. The power detector 24b couples its output to the comparator 30b of firing circuit 20 to control the output power level at the desired value.

Figures 7A, 7B:
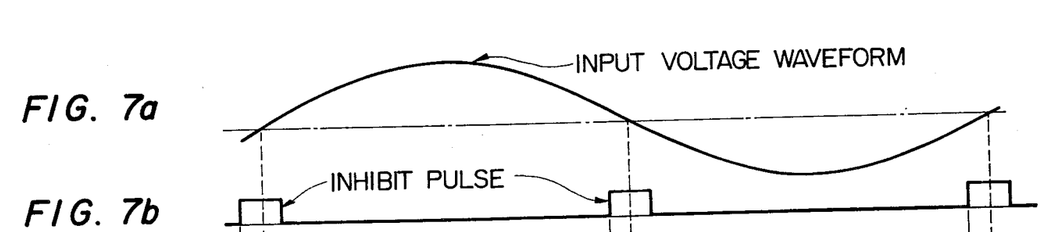
Figure 7C:
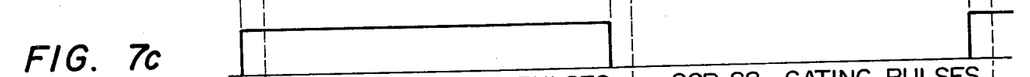
Figure 7D:
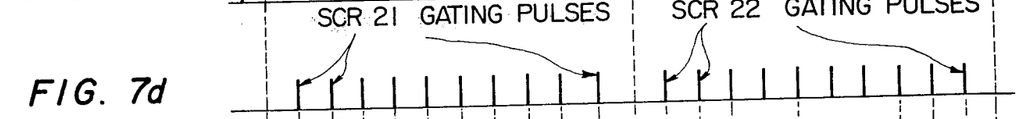
Figure 7E:
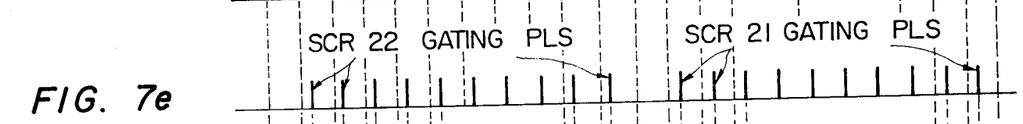
Figure 7F:
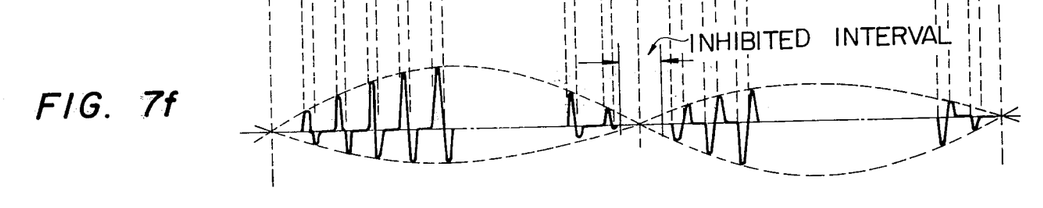
Figure 8A:
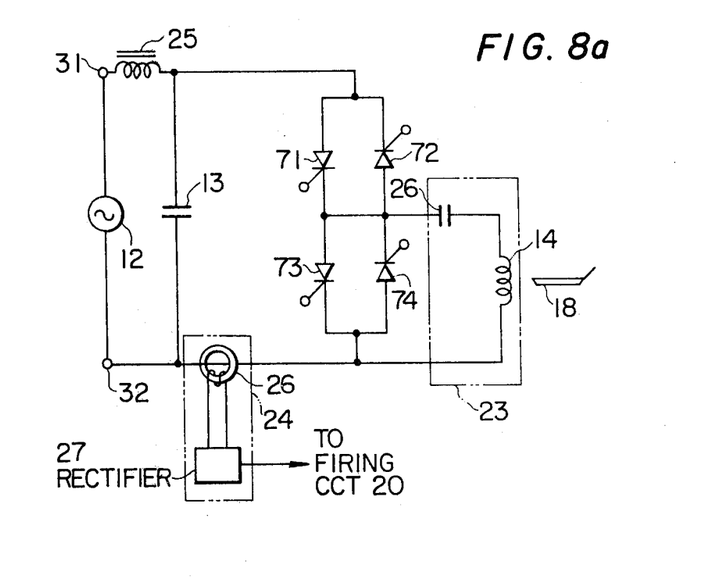
FIGS. 8a to 8c are circuit diagrams of another embodiment of the invention in which two pairs of inversely parallel connected solid state switching devices are employed in different circuit relations with resonant circuits.
Figure 8B:
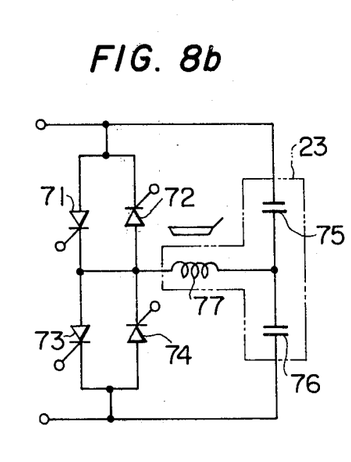
Figure 8C:
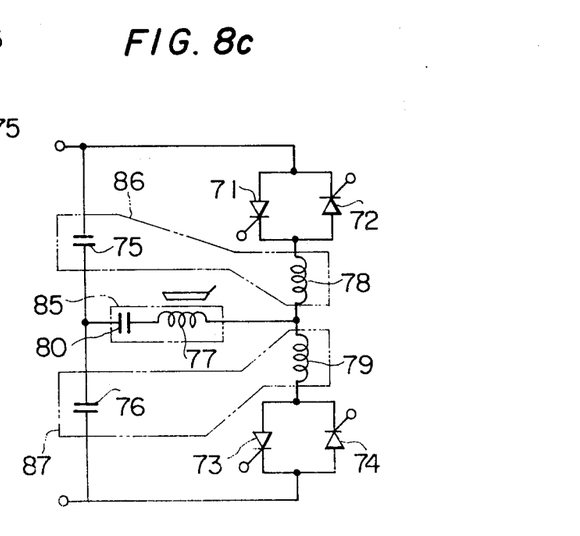
Figure 9:
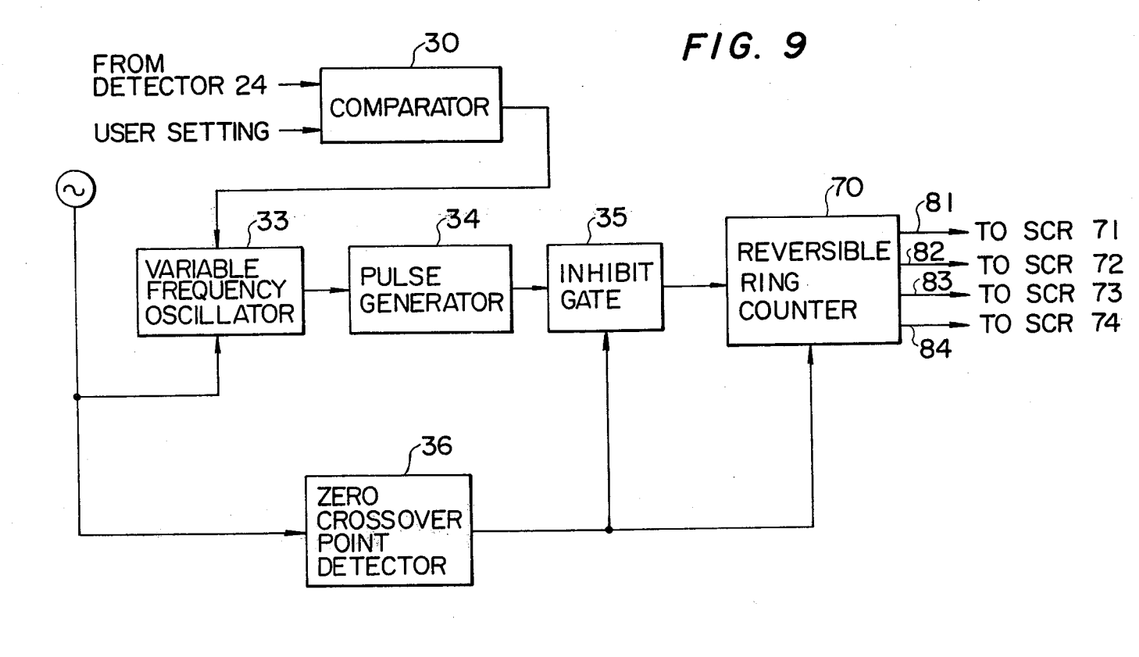
FIG. 9 is a diagram of a firing circuit used in connection with the circuits of FIGS. 8a to 8c.

The oscillating current will become as shown in FIG. 7f. From an examination of FIGS. 7a and 7f, it is noted that the oscillatory energization current flow that occurs during the reverse half cycle of each oscillation develops a current envelope as indicated by dashed lines which is 180° out of phase with respect to the input voltage waveform. This means that the power resulting from the product of relatively phase displaced voltage and current is negative and being returned to the power supply. This is an advantageous effect of the cycloconverter of the present invention from the power saving standpoint.

Where it is desired to provide a greater amount of power than is provided by a pair of gated conducting devices 21 and 22, two pairs of inversely parallel connected SCR's may be employed as shown in FIG. 8. In FIG. 8a, a first pair of inversely parallel connected SCR's 71 and 72 is connected in series to a second pair of inversely parallel connected SCR's 73 and 74, the first and second SCR pairs being connected across the input terminals 31 and 32 via a filter inductor 25. A resonating circuit 23 comprising a capacitor 26 and an inductor 14 is coupled across the second pair of SCR's 73 and 74 in parallel thereto and in series to the first pair of SCR's 71 and 72. A power detector 24 having a current transformer 26 and a rectifier 27 is coupled to the terminal 32 to detect the current representing the power withdrawn from the inductor 14 and supply the detected signal to a firing circuit 20 shown in FIG. 9. The firing circuit 20 is generally similar to that shown in FIG. 4 except that a reversible ring counter 70 is employed rather than a circuit consisting of the delay circuit 38 and the pulse distributer 39 of FIG. 4. The output from the pulse generator 34 is connected to the input of ring counter 70 which in response to the input pulse activates one of its output terminals 81 to 84 in succession so that the input pulse is distributed as indicated by a series of waveforms in FIG. 10. During the positive half cycle of the alternating current at source 12, the ring counter 70 operates to distribute the pulses in the order of its output terminals 81, 82, 83 and 84. The output of the zero crossover point detector 36 is also connected to the ring counter 70 to reverse its order of appearance of outputs at the beginning of the next negative half cycle of the source voltage. The ring counter 70 reverses its order of counting upon receipt of an inhibit pulse. A detailed description of the reversible ring counter is found in an article entitled "Reversible Ring Counters Utilizing The Silicon Controlled Switch" by Robert M. Muth et al., Application Note 90.58, 4/66 published by General Electric Company.

Figure 10:
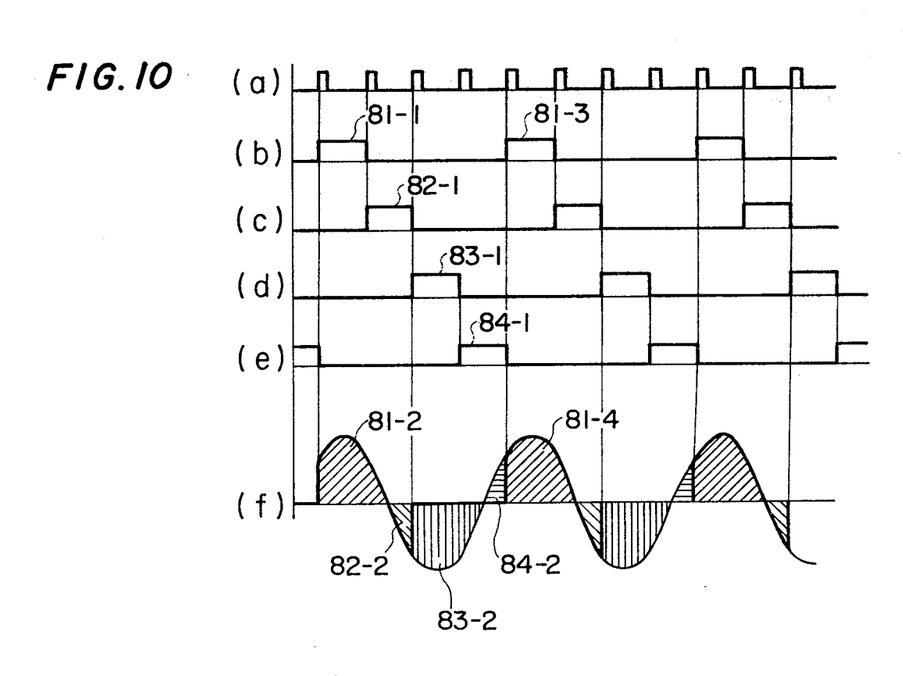
FIG. 10 is a waveform diagram useful for describing the operation of the circuit of FIGS. 8 and 9.

Assume that the input terminal 31 is positive with respect to the terminal 32, the ring counter 70 will place a first pulse on the output terminal 81 to thereby turn on SCR 71 causing the capacitor 26 to be positively charged to the source voltage. In FIG. 10, the first pulses 81-1 on output terminal 81 causes a current 81-2 to flow through the conducting SCR 71. In succession SCR 72 will be gated on by the pulse 82-1 which appears before the current 81-2 is still flowing through the SCR 71. Although the gating-on pulse 82-1 is being applied, the SCR 72 conducts no current until the current 81-2 falls to zero. The charge stored on the capacitor 26 will be oscillated through the conducting SCR 71 and through the resonating circuit 23 and capacitor 13 and reversely charge the capacitor 26 to cause a reverse current flow through the conducting SCR 72. While the reverse current is flowing, SCR 73 will be gated on the gating-on pulse 83-1 to conduct the reverse current during the rest of the negative half cycle of the oscillation. While SCR 73 is still conducting, SCR 74 will be rendered conductive by the next pulse 84-1. Therefore, currents as indicated in waveforms 82-2 and 83-2 will be conducted respectively by the SCR's 72 and 73. Capacitor 26 will then be charged positively to cause a current 84-2 to flow through the conducting SCR 74. SCR 71 will be again gated into conduction by the next pulses 81-3 to replenish a charge on the capacitor 26 causing a current 81-4 to flow in order to sustain oscillations in the subsequent period.

During the next negative half cycle of the source voltage, the firing order is reversed. However, the initial gating-on pulses supplied to SCR's 74 and 73 have no effect on the operation of cycloconverter since there is no charge on the capacitor 26. The subsequent turn-on of SCR 72 will cause capacitor to be charged negatively to initiate oscillations which will be sustained by subsequent conduction of SCR's 71, 74 and 73.

When the source voltage is slightly above the inhibited level, the intervals between successive gating-on pulses are prolonged to allow the capacitor to be charged up sufficiently to sustain oscillations.

It is to be noted that in the firing process SCR's 71 and 72 are simultaneously gated on in the transitory period when the oscillatory current reverts its direction of flow, and SCR's 72 and 73 are also simultaneously gated on in the transitory period during which currents 82-2 and 83-2 are flowing, and therefore, a smooth transition of current conduction is achieved which results in a waveform generally similar to an ideal sinusoidal wave. Therefore, the higher frequency harmonics such as R-F components are effectively suppressed and as a result no filter circuit for filtering out the R-F components is necessary.

A modification of the cycloconverter 10 is illustrated in FIG. 8b in which series-connected capacitors 75 and 76 are connected across the first and second SCR pairs in parallel, and an induction heating coil 77 is connected between a point intermediate the first and second SCR pairs and a point intermediate the capacitors 75 and 76. In operation, assume that the input terminal 31 is positive with respect to the terminal 32 and capacitors 75 and 76 are consequently charged positively. When SCR 71 is gated into conduction by a pulse 81-1, a forward oscillating current 81-2 will flow through the conducting SCR 71 and through the load inductor 77 to reversely charge the capacitor 75. During the forward current flow SCR 72 will be applied with a pulse 82-1 and upon the reversal of the polarity of capacitor 75 a reverse current 82-2 will pass through the conducting SCR 72. While the SCR 72 is conducting, SCR 73 will be gated into conduction by the pulse 83-1, as a result of which the charge stored on capacitor 76 is oscillated through the conducting SCR 73 and through inductor 77 producing a reverse current 83-2 in its first oscillating half cycle and then a forward current 84-2 when SCR 74 is gated on by a pulse 84-1. In the negative half cycle of the source voltage, capacitors 75 and 76 are charged negatively and the firing order is reversed. SCR 74 is gated into conduction in the first place to cause the charge stored on capacitor 76 to oscillate through the conducting SCR 74 and inductor 77 in its first half cycle and then through the successively turned-on SCR 73 in its second half cycle. SCR 72 and then SCR 71 will be gated into conduction in succession to produce an oscillatory current through the conducting SCR's 72 and 71 and through the load inductor 77.

The cycloconverter 10 is further modified into a form as shown in FIG. 8c to provide a perfect sinusoidal output waveform. In this modified form, inductors 78 and 79 are connected in series between a first SCR pair 71, 72 and a second SCR pair 73, 74 in a first circuit path. Capacitors 75 and 76 are connected in series in a second circuit path which is connected in parallel with the first circuit path. A first resonating circuit 85 comprised by an induction heating coil 77 and a capacitor 80 in a series circuit relation is connected between a point intermediate the inductors 78 and 79 and a point intermediate the capacitors 75 and 76. Capacitor 75 and inductor 78 are tuned to a predetermined frequency to form a second resonating circuit 86. Capacitor 76 and inductor 79 are also tuned to the first frequency to form a third series resonant circuit 87. The first resonant circuit 77 is tuned to a frequency which is double the frequency of either circuit 86 or 87.

Figure 11A:
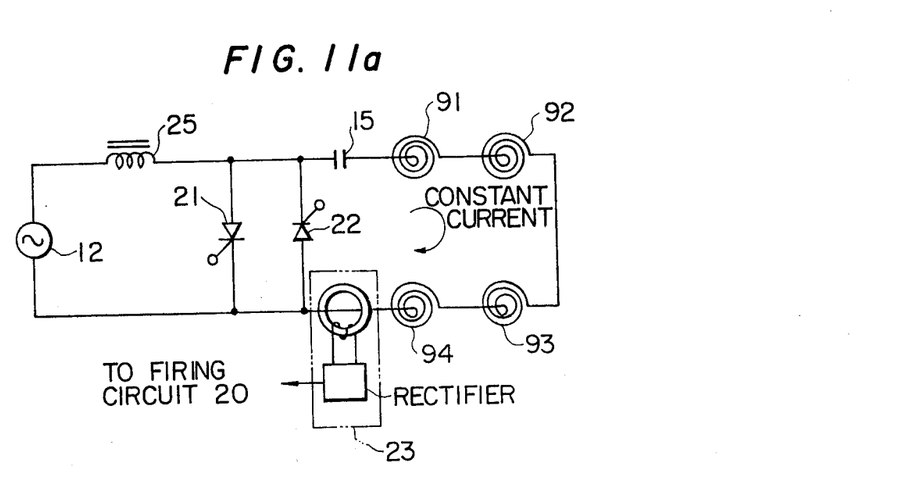
FIGS. 11a and 11b illustrate methods of controlling the output of the cycloconverter of the invention.
Figure 11B:
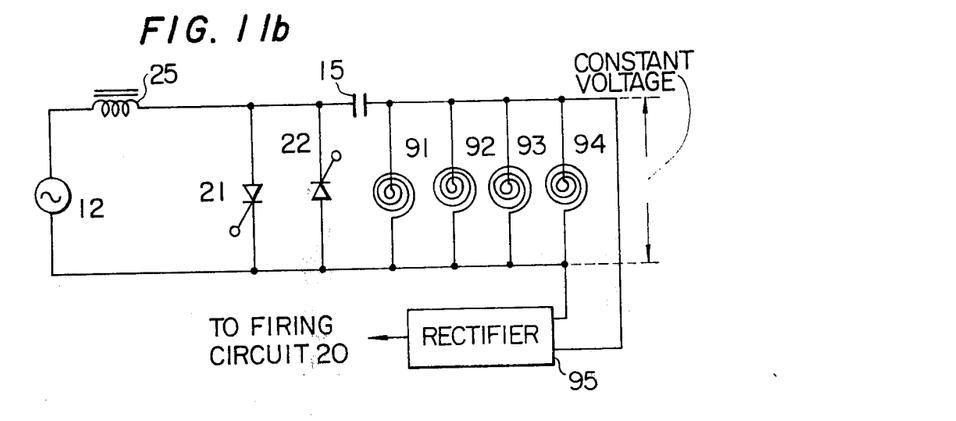

It is often desirable to provide a plurality of induction heating coils in a series circuit relationship as illustrated in FIG. 11a and in a parallel circuit relationship as illustrated in FIG. 11b. In the series circuit arrangement of FIG. 11a the current flow through induction heating coils 91, 92, 93 and 94 is maintained constant when a desired power level is attained. The power detector 23 senses the current through the coils 91 to 94 and feeds a voltage signal representing the detected current to the firing circuit 20. The comparator 30 of the firing circuit 20 (FIG. 4) compares it with a user's setting value to provide an output representing the difference between the actual power delivered to the load and the desired power level. The output from the comparator 30 controls the frequency of the oscillator 33 in such manner that when the actual power is lower than the desired level the frequency is raised until the desired level is reached and when the actual power is higher than the desired level the frequency is lowered to attain the desired level so that the average value of the energization current through coils 91 to 94 is held constant for a given level of user setting regardless of the number of energized or switched-on induction heating coils.

In the arrangement of FIG. 11b, induction heating coils 91 to 94 are connected in parallel to the SCR pair 21, 22 in which the voltage developed across the parallel-connected coils 91 to 94 is sensed by a power detector formed by a rectifier 95 connected across the coils 91 to 94. The rectified voltage represents the power delivered to the load and is applied to the comparator 30b of firing circuit 20 (FIG. 4). As described in connection with the circuit of FIG. 11a, the frequency of the oscillator 33 will be controlled to attain the desired power level and the average value of the voltage across the coil 91 to 94 is maintained constant for a given level of user setting regardless of the number of energized induction heating coils.

Figure 11C:
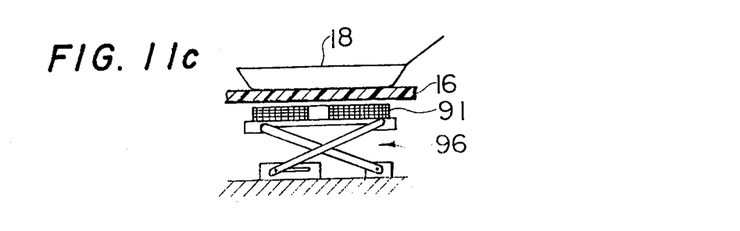

In the arrangements of both FIGS. 11a and 11b, the electromagnetic coupling between the load and each induction heating coil is achieved by an elevating mechanism as shown in FIG. 11c in which each of the induction heating coils 91 to 94 is supported by a cross-arm elevating mechanism 96 which may be actuated manually in such manner that the air gap between the load 18 and each coil is varied to individually control the power actually delivered to the load on each coil.

The high frequency electrical oscillations of the power converter 10 can also be utilized to generate a high tension unidirectional voltage in addition to generating electromagnetic flux for induction heating with the use of a step-up transformer having a fewer number of turns than is required to generate from a low frequency source such as obtained from the commercial AC outlet.

Figure 12A:
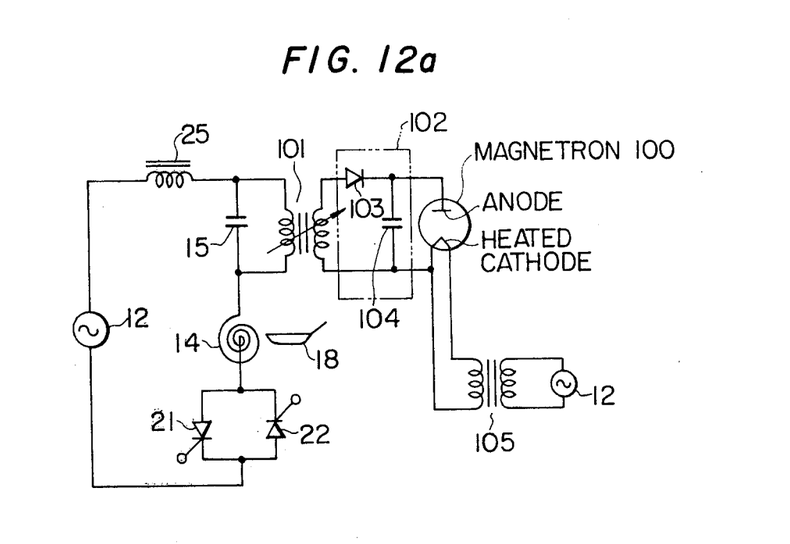
FIGS. 12a and 12b illustrate another embodiment of the invention in which the power output from the cycloconverter is utilized in delivering a high tension unidirectional voltage for powering a magnetron used in a microwave oven.
Figure 12B:
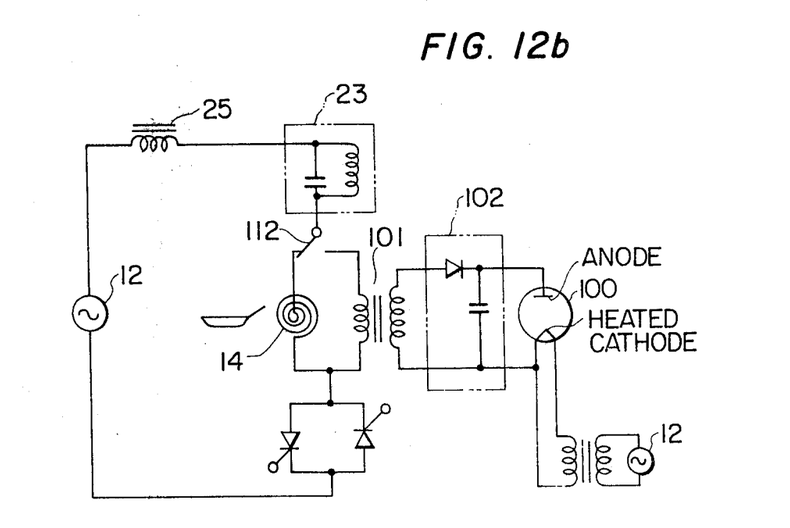
Figure 13A:
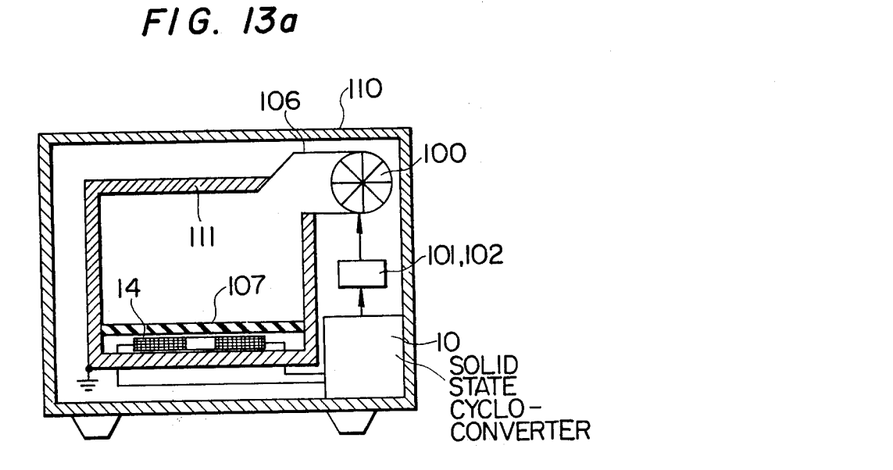
FIGS. 13a and 13b are schematic views illustrating the arrangement of various components of the embodiment of FIGS. 12a and 12b.
Figure 13B:
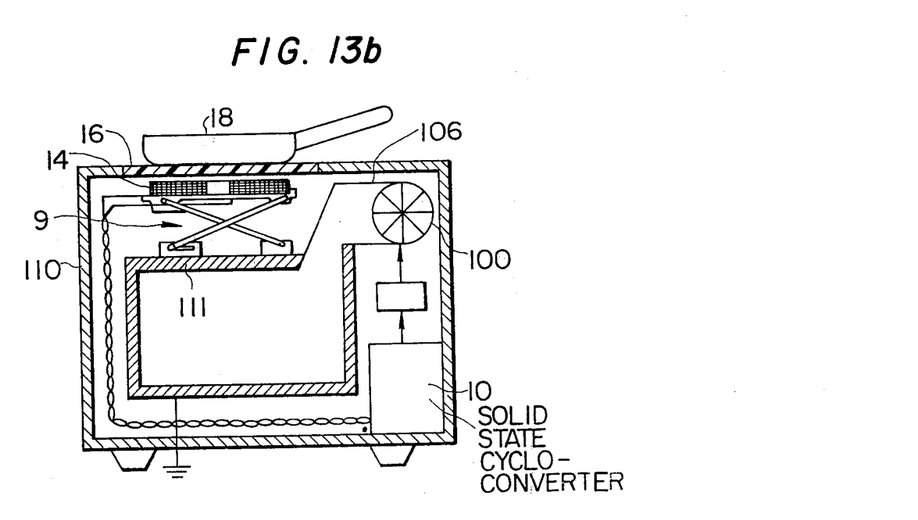

An embodiment shown in FIGS. 12 and 13 illustrates a combination in which the induction heating apparatus previously described is housed in the same compartment with a microwave oven of a conventional type. In FIG. 12a, a step-up transformer 101 has its primary winding connected across the terminals of the resonation capacitor 15 and its secondary winding coupled to a rectifier circuit 102 including a diode 103 and a smoothing capacitor 104. The rectifier 102 converts the high frequency, high tension voltage developed across the secondary of transformer 101 into a high tension unidirectional voltage which is supplied to the anode and the heated cathode of a magnetron 100. The cathode of magnetron 100 is supplied with a low voltage AC current from a transformer 105 coupled to the AC power source 12. The magnetron 100 generates oscillations at a frequency in the microwave region which is radiated to an electromagnetically shielded chamber 111 of a microwave oven housing 110 through a waveguide 106 (FIG. 13a). The chamber 111 is constructed of aluminum and electrically connected to ground for shielding purposes. A non-metallic utensil support plate 107 is disposed on the the lower portion of the chamber 111 at a position spaced from the bottom wall thereof. The induction heating coil 14 is disposed within the space between the support 107 and the bottom wall of the chamber 111 and connected to the power converter 10 previously described. Since aluminum is a non-magnetic material, no heat will substantially be produced by the high frequency electromagnetic field set up by the induction heating coil 14 in the walls of the chamber 111 close to the coil 14. The converted high tension DC voltage may be adjusted by varying the electromagnetic coupling between the primary and secondary windings of the step-up transformer 101 as indicated by the arrow in the drawings. The non-metallic support 107 serves as a common surface for metallic utensil for induction heating and non-metallic utensil for heating under the influence of the microwave radiant energy. Therefore, it is important to indicate to the user that when the apparatus is operated in the induction heating mode the utensil be of metallic ferrous material while in the microwave mode of operation the utensil be of non-metallic material. Since the microwave radiant energy produces heat in the foodstuff at uniform temperature throughout, while the induction heating produces heat in the material of utensil which in turn heats up the foodstuff therein progressively from the outer surface, different cooking conditions are provided to achieve different results, for example, the induction heating produces a burning effect which causes a slight burning on the surface of the foodstuff so that different taste may be achieved from that provided by microwave heating.

A changeover switch 112 may be provided to operate either in the induction heating mode or in the microwave heating mode. The switch 112 may be a transfer type as shown in FIG. 12b and has a moving contact connected between the resonant circuit 23 and the coil 14 and switched to provide connection between the resonant circuit 113 and the primary winding of the transformer 101. In this example, the transformer 101 has an equal inductance to that of induction heating coil 14 to provide oscillation at the same frequency when the switch 112 is connected to either side of its stationary contacts. In FIG. 13b, the induction heating coil 14 is carried by an elevating mechanism 91 as described in connection with FIG. 11c. The elevating mechanism 91 is in turn disposed on the top wall of the shielded chamber 111 of microwave oven and housed in the same casing 110 with the magnetron microwave oscillator 100. The casing 110 has on its top wall a non-metallic utensil support plate 16 flush with the other portion of the top wall and located over the induction heating coil 14. In this arrangement foodstuff is placed in the chamber 111 when heated by the microwave radiant energy and on the support plate 16 when heated in the induction heating mode. The height of the induction heating coil 14 is adjusted manually by a mechanical linkage (not shown) which is accessible to the user.

Figure 14:
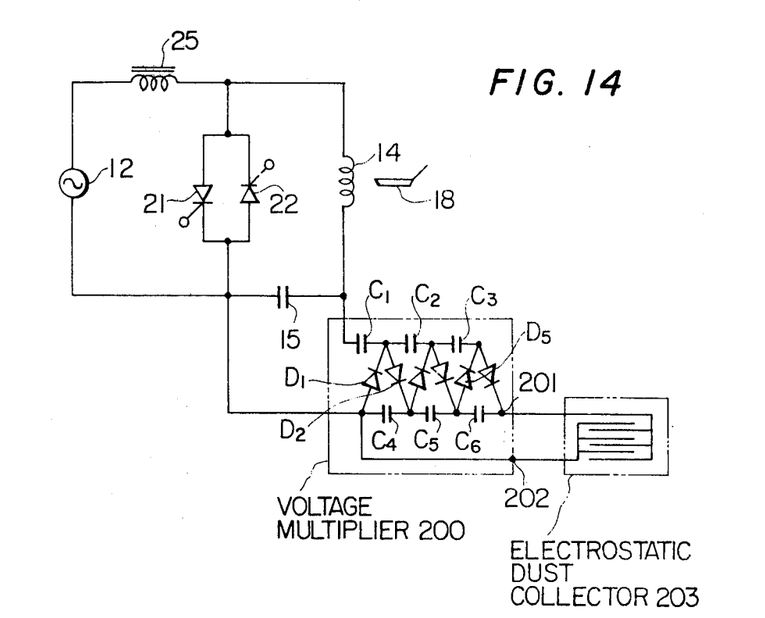
FIG. 14 is a circuit diagram showing another embodiment of the invention in which the power output from the cycloconverter is converted into a high tension unidirectional voltage for establishing a high electrostatic field for dust collecting purposes.
Figure 15:
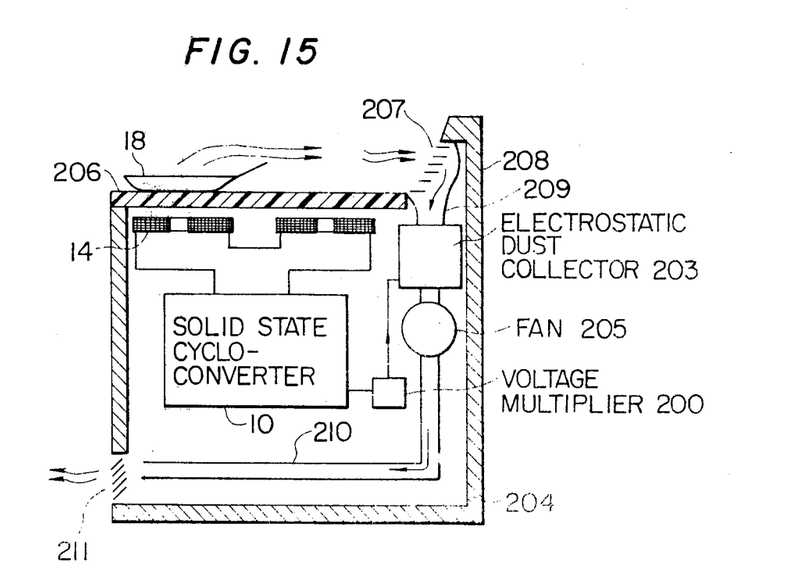
FIG. 15 is a view illustrating the arrangement of the various components of the circuit of FIG. 14.

Another example of utilizing the ultrasonic frequency oscillations of the power convertor 10 is shown in FIGS. 14 and 15. In FIG. 14, a voltage multiplier 200 is connected across the capacitor 15 of resonant circuit 23 to develop a high tension DC voltage at the output terminals 201 and 202 to which is connected an electrostatic dust collector 203. The voltage multiplier 200 comprises a first group of series-connected capacitors $C_1$ to $C_3$ and a second group of series-connected capacitors $C_4$ to $C_6$ and a plurality of diodes $D_1$ to $D_5$. Each of the diodes is connected between the junctions of the first and second groups of capacitors and alternately poled in opposite directions so that capacitors of the first group are connected by the diodes to the capacitors of the second group in staggered relation to each other. Each of the capacitors in either group stores charge which builds up increasingly toward the output terminal 201. The dust collector 203 is of the conventional design which includes a plurality of oppositely facing electrodes to which is connected the high DC voltage obtained from the voltage multiplier 200 to establish a strong electric field between each pair of electrodes through which dust may be permitted to pass. FIG. 15 shows an arrangement of the dust collector 203 in the induction heating apparatus as previously described. The dust collector 203 is disposed within a housing 204 having a non-metallic utensil support top 206, air inlet grille 207 provided in the opening between the top 206 and the rear panel 208 and has an air inlet connected to the air inlet grille 207 by a passage 209 and an air outlet side connected to a fan 205 disposed in a duct 210 which leads to an air outlet grille 211 provided on the lower part of the housing 204. The induction heating coil 14 which is energized by the output from power convertor 10 is located underside of the utensil support top 206 on which a metallic utensil 18 may be placed. When the fan 15 is energized, a forced air flow will be produced through the air inlet grille 207 to the outlet grille 211. Objectionable fumes and ordours produced from the utensil 18 on the top plate 206 will be inducted through the inlet grille 207 and passed through the dust collector 203 where they will be charged by the high electrostatic field between the collecting electrodes and adhered thereto This is particularly advantageous when foodstuff is fried which results in producing a considerable amount of greasy material.

What is claimed is:

1. An induction heating apparatus comprising, a pair of input terminals connectable in use to a source of low frequency alternating voltage, at least a pair of first and second gate-controlled unidirectional conducting devices inversely parallel connected to the input terminals, means sensitive to the polarity of said alternating voltage for generating an output indicative of the polarity of the alternating voltage, means for gating on said first and second gate-controlled unidirectional conducting devices in succession at a high frequency in a given order in response to the output from said polarity sensitive means indicating one polarity of the alternating voltage and in succession at the high frequency in a reversed order in response to the output from said polarity sensitive means indicating the opposite polarity of the alternating voltage, and high-frequency commutating circuit means including an induction heating coil and a capacitor in series thereto responsive to a current produced when one of the gate-controlled conducting devices is gated on for producing in succession a commutating current that flows through said commutating circuit means and the subsequently gated-on gate-controlled conducting device in the opposite direction.

2. An induction heating apparatus as claimed in claim 1, further comprising means responsive to the instantaneous value of the source of alternating voltage for controlling the gating frequency of said gate-controlled conducting devices substantially in proportion to said instantaneous value of the source voltage.

3. An induction heating apparatus as claimed in claim 1, further comprising means for detecting when the instantaneous value of the source of alternating voltage is below a predetermined value and means for inhibiting said gate-controlled conducting devices in response to the output of said detecting means.

4. An induction heating apparatus as claimed in claim 1, further comprising electrical quantity detecting means for detecting an electrical quantity representative of power delivered to a load in overlying relation with said coil, means for comparing the detected electrical quantity with a fixed reference representing and corresponding to a desired power level to detect the deviation of the power delivered to said load from the desired power level, and means for controlling the gating frequency of said gate-controlled conducting devices in the direction of the deviation of said delivered power from said desired power level so as to minimize said deviation.

5. An induction heating apparatus as claimed in claim 4, further comprising a second induction heating coil connected in series to the first induction heating coil to form a series resonant circuit so that the first and second induction heating coils are energized by a high frequency energization current of equal magnitude, and wherein said electrical quantity detecting means is connected in said series resonant circuit to detect a current flow therethrough and said frequency controlling means is coupled to the electrical quantity detecting means to control the frequency of said firing pulses such that said current flow is maintained constant regardless of the magnitude of power delivered to said load.

6. An induction heating apparatus as claimed in claim 5, further comprising a vertically movable support on which the induction heating coil is disposed, and means for adjusting the spacing between the load and the support.

7. An induction heating apparatus as claimed in claim 4, further comprising a second induction heating coil connected in parallel with the first induction heating coil, and wherein said electrical quantity detecting means is connected across said induction heating coils to detect a voltage developed thereacross and said frequency controlling means is coupled to said comparing means to control the gating frequency of said gate-controlled conducting device in the direction of the deviation of said detected voltage from said fixed reference to minimize said deviation so that said voltage across said induction heating coils is maintained constant regardless of the magnitude of power delivered to loads placed over said induction heating coils.

8. An induction heating apparatus as claimed in claim 7, further comprising a vertically movable support on which each of the first and second induction heating coils is disposed, and means for adjusting the spacing between the associated load and the support.

9. An induction heating apparatus as claimed in claim 4, further comprising a second induction heating coil connected in series with the first induction heating coil, and wherein said electrical quantity detecting means is connected in series with said induction heating coils to detect a current passing therethrough and said frequency controlling means is coupled to said comparing means to control the gating frequency of said gate-controlled conducting devices in the direction of the deviation of said detected current from said fixed reference to minimize said deviation so that said current is maintained constant regardless of the magnitude of power delivered to loads placed over said induction heating coils.

10. An induction heating apparatus as claimed in claim 1, wherein said pair of gate-controlled conducting devices is connected in series to the commutating circuit means.

11. An induction heating apparatus as claimed in claim 1, wherein said pair of gate-controlled conducting devices is connected in parallel with the commutating circuit means.

12. An induction heating apparatus as claimed in claim 1, further comprising, in combination therewith, means for converting the current flowing through said commutating circuit means into a high tension DC voltage, a housing having an electromagnetically shielded chamber therein made of a metal of substantially nonmagnetic material, a magnetron having a heated cathode and an anode energized by said high tension DC voltage to produce high frequency oscillations in the microwave region, and means for emitting microwave energy to said chamber.

13. An induction heating apparatus as claimed in claim 12, wherein said induction heating coil is disposed on top of the housing.

14. An induction heating apparatus as claimed in claim 13, further comprising a vertically movable support on which the induction heating coil is disposed and means for adjusting the height of the induction heating coil with respect to a load placed in overlying relation therewith.

15. An induction heating apparatus as claimed in claim 12, wherein said converting means comprises a step-up transformer having its primary winding connected to receive the current flowing through said induction heating coil, a rectifier connected to the secondary winding of the transformer to generate said high tension DC voltage, and means for adjusting electromagnetic coupling between the primary and secondary windings of the transformer.

16. An induction heating apparatus as claimed in claim 15, wherein said adjusting means is connected in the commutating circuit means.

17. An induction heating apparatus as claimed in claim 12, wherein said induction heating coil is disposed on the bottom wall of the shielded chamber, and wherein a non-metallic utensil support is disposed in overlying relation with the induction heating coil.

18. An induction heating apparatus as claimed in claim 1, further comprising means for converting the current flowing through said induction heating coil into a high tension DC voltage, a housing having a nonmetallic top wall and side and bottom walls, an electrostatic precipitator energized by said high tension DC voltage, and means located adjacent said top wall for intaking air to said electrostatic precipitator, and wherein the induction heating coil is disposed in underlying relation with said top wall of the housing.

19. An induction heating apparatus as claimed in claim 18, wherein said converting means comprises a voltage multiplier comprising a pair of first and second groups of series connected capacitors and a plurality of diodes each being connected across a point of connection between successive capacitors of the first group and a point of connection of successive capacitors of the second group, said diodes being alternately poled in opposite directions.

20. An induction heating apparatus comprising:
a first pair of inversely parallel connected first and second gate-controlled switching devices, a second pair of inversely parallel-connected third and fourth gate-controlled switching devices, the first and second pairs being connected in use in series to a source of low frequency alternating voltage, and wherein the first and third switching devices are poled in the same direction of conduction and the second and fourth switching devices are poled in the opposite direction of conduction;
means sensitive to the polarity of said alternating voltage for generating an output indicative of the polarity of the alternating voltage;
means for gating on said first, second, third and fourth switching devices in succession in a given order in response to the output from said polarity sensitive means indicating one of the polarity of the alternating voltage and in a reversed order in response to the output from said polarity sensitive means indicating the opposite polarity of the alternating voltage; and
high frequency commutating circuit means including an induction heating coil and a commutating capacitor in series thereto responsive to a current produced when one of the gate-controlled switching devices is gated on for producing in succession a commutating current that flows through said commutating circuit means and a subsequently gated-on switching device.

21. An induction heating apparatus as claimed in claim 20, wherein said commutating circuit means is connected across one of said first and second pairs of switching devices.

22. An induction heating apparatus as claimed in claim 20, wherein said commutating circuit means comprises a first and a second capacitive element connected in series across said first and second pairs of switching devices, and wherein said induction heating coil is connected between a point intermediate the first and second pairs of switching devices and a point intermediate the first and second capacitive elements.

23. An induction heating apparatus as claimed in claim 20, wherein said commutating circuit means comprises a pair of first and second inductive elements connected in series to said first and second pairs of switching devices, a pair of first and second capacitive elements connected in series across said first and second pairs of switching devices, a first resonating circuit including said induction heating coil connected between a point intermediate the first and second inductive elements and a point intermediate the first and second capacitive elements, the first capacitive and inductive elements being connected in a second resonating circuit configuration, the second capacitive and inductive elements being connected in a third resonating circuit configuration, the first resonating circuit being tuned to a frequency which is double the frequency to which the second and third resonating circuits are tuned.

* * * * *